US010804200B2

(12) United States Patent
Chen et al.

(10) Patent No.: US 10,804,200 B2
(45) Date of Patent: Oct. 13, 2020

(54) INTEGRATED CIRCUIT HAVING A HIGH CELL DENSITY

(71) Applicant: Taiwan Semiconductor Manufacturing Company Limited, Hsinchu (TW)

(72) Inventors: Sheng-Hsiung Chen, Hsinchu County (TW); Chung-Hsing Wang, Hsinchu County (TW); Fong-yuan Chang, Hsinchu County (TW); Lee-Chung Lu, Taipei (TW); Li-Chun Tien, Tainan (TW); Po-Hsiang Huang, Tainan (TW); Shao-huan Wang, Taichung (TW); Ting Yu Chen, Hsinchu (TW); Yen-Pin Chen, Taipei (TW); Chun-Chen Chen, Hsinchu County (TW); Tzu-Hen Lin, Hsinchu (TW); Tai-Yu Cheng, Pingtung (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/199,540

(22) Filed: Nov. 26, 2018

(65) Prior Publication Data
US 2019/0096805 A1     Mar. 28, 2019

Related U.S. Application Data

(62) Division of application No. 15/468,281, filed on Mar. 24, 2017, now Pat. No. 10,157,840.
(Continued)

(51) Int. Cl.
*H01L 23/528* (2006.01)
*H01L 23/522* (2006.01)
(Continued)

(52) U.S. Cl.
CPC ........ *H01L 23/5283* (2013.01); *G06F 30/367* (2020.01); *G06F 30/392* (2020.01);
(Continued)

(58) Field of Classification Search
CPC ............. H01L 23/5283; H01L 23/5286; H01L 23/5226; G06F 30/398; G06F 30/367
See application file for complete search history.

(56) References Cited

U.S. PATENT DOCUMENTS

| 2012/0331426 A1* | 12/2012 | Lu | ............................. G03F 1/70 |
| | | | 716/52 |
| 2014/0183647 A1* | 7/2014 | Lu | ......................... H01L 27/092 |
| | | | 257/369 |
| 2015/0339430 A1* | 11/2015 | Nifong | .................. G06F 30/398 |
| | | | 716/112 |

FOREIGN PATENT DOCUMENTS

| TW | I306567 | 5/1997 |
| TW | 569108 | 1/2004 |

OTHER PUBLICATIONS

Taiwan Office Action; Application No. 106119087; dated Apr. 6, 2020.

* cited by examiner

*Primary Examiner* — Julia Slutsker
(74) *Attorney, Agent, or Firm* — Jones Day

(57) ABSTRACT

An integrated circuit includes a cell that is between a substrate and a supply conductive line and that includes a source region, a contact conductive line, a power conductive line, and a power via. The contact conductive line extends from the source region. The power conductive line is coupled to the contact conductive line. The power via interconnects the supply conductive line and the power conductive line.

20 Claims, 14 Drawing Sheets

Related U.S. Application Data

(60) Provisional application No. 62/429,097, filed on Dec. 2, 2016.

(51) Int. Cl.
| | | |
|---|---|---|
| *H01L 27/088* | (2006.01) | |
| *H02K 19/20* | (2006.01) | |
| *G06F 30/367* | (2020.01) | |
| *G06F 30/392* | (2020.01) | |
| *G06F 30/394* | (2020.01) | |
| *G06F 30/398* | (2020.01) | |
| *H03K 19/20* | (2006.01) | |

(52) U.S. Cl.
CPC .......... *G06F 30/394* (2020.01); *G06F 30/398* (2020.01); *H01L 23/5226* (2013.01); *H01L 23/5286* (2013.01); *H01L 27/088* (2013.01); *H03K 19/20* (2013.01)

|  | Cell | No. of power vias | Time delay |
|---|---|---|---|
| 1010 | Parent cell | 2 | 30 ps. |
| 1010a | Child cell | 3 | 20 ps. |
| 1010b | Child cell | 6 | 10 ps. |

FIG. 10    1000

|  | Cell | No. of power vias | Time delay |
|---|---|---|---|
| 1110 | Parent cell | 3 | 60 ps. |
| 1110a | Child cell | 4 | 45 ps. |
| 1110b | Child cell | 5 | 1:2 |
| 1110c | Child cell | 6 | time delay of parent cell - 35 ps. |

FIG. 11    1000

INTEGRATED CIRCUIT HAVING A HIGH CELL DENSITY

CROSS-REFERENCE TO RELATED APPLICATION

This application is a divisional application of U.S. patent application Ser. No. 15/468,281, filed Mar. 24, 2017, which claims priority to U.S. Provisional Patent Application No. 62/429,097, filed Dec. 2, 2016, both of which are incorporated herein by reference in their entireties.

BACKGROUND

An integrated circuit includes a plurality of cells. Each cell, such as a standard cell, includes one or more logic gates, e.g., a NOT gate or an inverter. Circuit functionality can be expanded by increasing the number of cells of the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10 and 11 are tables illustrating the fourth exemplary embodiment of a cell library according to the present disclosure.

DETAILED DESCRIPTION

Figure 1:
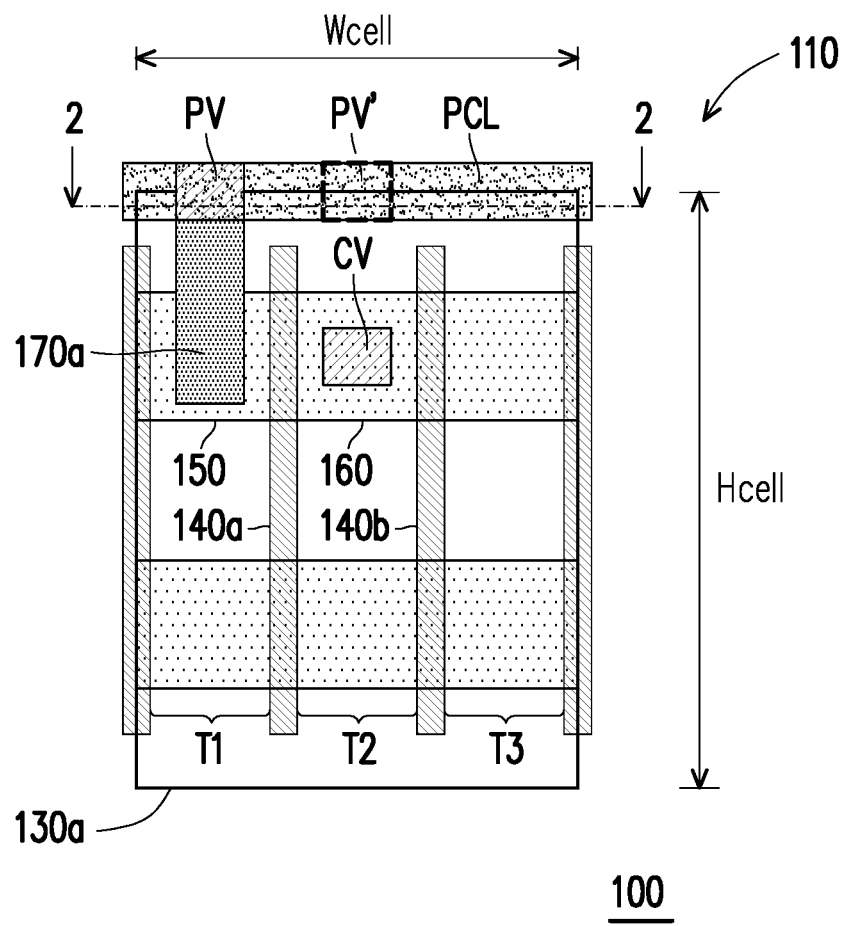
FIG. 1 is a schematic top view illustrating the first exemplary embodiment of a cell library according to the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A cell is configured to perform a cell function. For example, the cell may be implemented as an inverter configured to invert a signal from low to high or vice versa. In some embodiments, the cell includes an AND gate, a NAND gate, an OR gate, a NOR gate, an XOR gate, an XNOR gate, another logic gate, or a combination thereof. In such some embodiments, the cell is referred to as a standard cell. A cell library stores a plurality of cells therein. FIG. 1 is a schematic top view illustrating the first exemplary embodiment of a cell library 100 according to the present disclosure. A cell 110 of the cell library 100 is over a substrate, is enclosed by a cell boundary 130a, has a cell height (Hcell) and a cell width (Wcell), and includes gate electrodes 140a, 140b, a source region 150, a drain region 160, a contact conductive line 170a, a contact via (CV), and a power via (PV). As can be seen from FIG. 1, the gate electrodes 140a, 140b extend along the cell height (Hcell) and are arranged along the cell width (Wcell). When numbered from a left edge of the cell boundary 130a, the cell 110 is divided into odd-numbered tracks (T1, T3) and an even-numbered track (T2).

A layout of a semiconductor device, e.g., an application specific integrated circuit (ASIC), is designed with an assistance of a software tool, such as an auto placement and routing (APR) tool. In the design of the integrated circuit layout, the APR tool first retrieves cells, one of which is, e.g., cell 110, from a cell library. Then, in a subsequent placement operation, the APR tool places the cells at various locations in the layout. After the placement operation, the APR tool simulates the layout to check compliance thereof with a minimum distance design rule. The minimum distance design rule, for example, requires a vertical distance between a power via (e.g., power via PV), and a contact via (e.g., contact via CV), along the height (Hcell) in the same track be equal to or greater than a threshold. A vertical distance less than the threshold may cause a short circuit between a power via and a contact via in the same track. While this rule is typically followed intra-cell, interactions between neighboring cells can be problematic.

Figure 2:
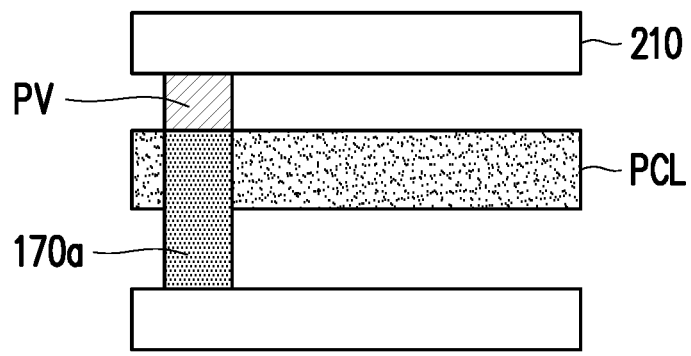
FIG. 2 is a schematic sectional view taken along line 2-2 of FIG. 1 according to the present disclosure.

With reference to FIG. 1 in further detail, the source region 150, the contact conductive line 170a, and the power via (PV) are at the odd-numbered track (T1). The power via (PV) facilitates connection of the cell 110 to a supply conductive line, e.g., supply conductive line 210 of FIG. 2, which runs across substantially the entire width (Wcell) above the cell 110, and is configured to receive a supply voltage, VDD or VSS. For example, FIG. 2 is a schematic sectional view taken along line 2-2 of FIG. 1 according to the present disclosure. As shown in FIG. 1, the contact conductive line 170a extends from the source region 150 to the power via (PV). The power via (PV) is at a top edge of the cell boundary 130a shown in FIG. 1 and interconnects the contact conductive line 170a and the supply conductive line 210 on the level above, shown in FIG. 2.

The drain region 160 and the contact via (CV) are at the even-numbered track (T2). The contact via (CV) facilitates connection of the cell 110 to a signal conductive line above the cell 110 and configured to receive a signal, e.g., data or clock signal. For example, the contact via (CV) interconnects the drain region 160 and the signal conductive line.

As illustrated in FIG. 1, during the layout design, a cell that is above and that abuts against the cell 110 may include a power via (indicated by dash lines PV1') at the track (T2) where the contact via (CV) resides. The power via (PV') and the contact via (CV) might have a vertical distance therebetween of less than the minimum distance design rule threshold. In that case, the layout does not comply with, or violates, the minimum distance design rule and has to be redesigned, e.g., to re-align the cells or to place the cells separately. This layout redesigning delays the manufacture of the integrated circuit and can result in less space efficient design.

As described below, the power conductive line (PCL) permits power vias to be positioned therealong and be at different tracks than contact vias while achieving the same functionality. Because they will be positioned in different tracks, a vertical distance between a power via and a contact via of a cell can thus be made less than the minimum distance design rule threshold, allowing shortening of a cell height of the cell. Moreover, as described below, the power conductive line (PCL) facilitates insurance that the abutment between cells during the design of a layout would comply with the minimum distance design rule. Further, as described below, the power conductive line (PCL) can maximize power vias that can be connected to a cell. This minimizes electromigration and current-resistance (IR) drop of an integrated circuit. Electromigration is the migration of ions from a first location to a second location of a conductive line and causes formation of voids at the first location, which may result in an open circuit, and accumulation of ions at the second region, which may result in a short circuit. IR drop is the reduction of a voltage at a first node of a circuit from a second node at which the voltage is applied.

Figure 4:
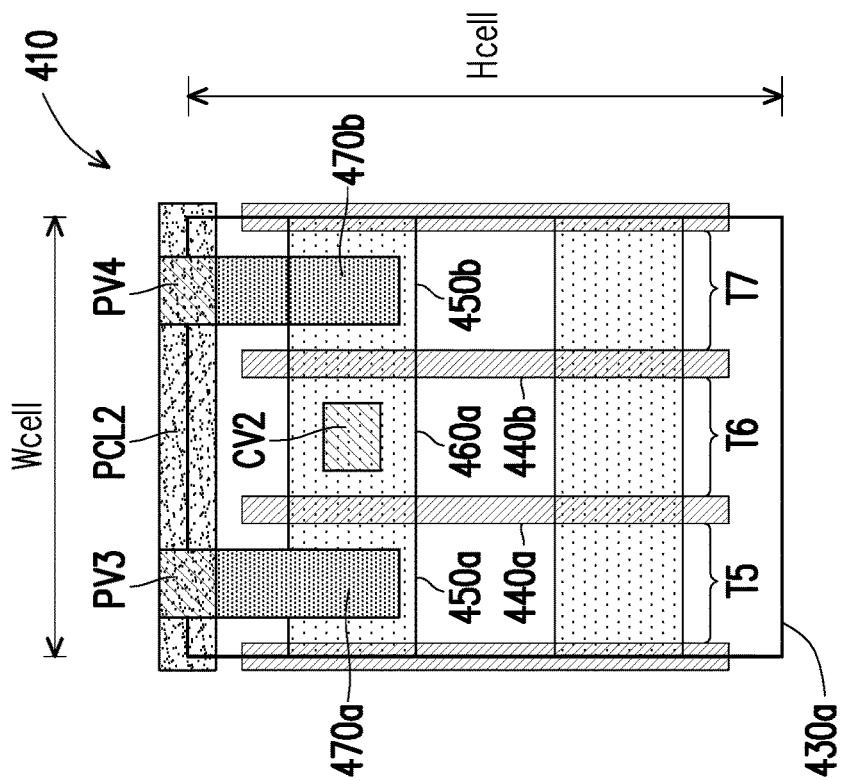
FIGS. 3 and 4 are schematic top views illustrating the second exemplary embodiment of a cell library according to the present disclosure.
Figure 3:
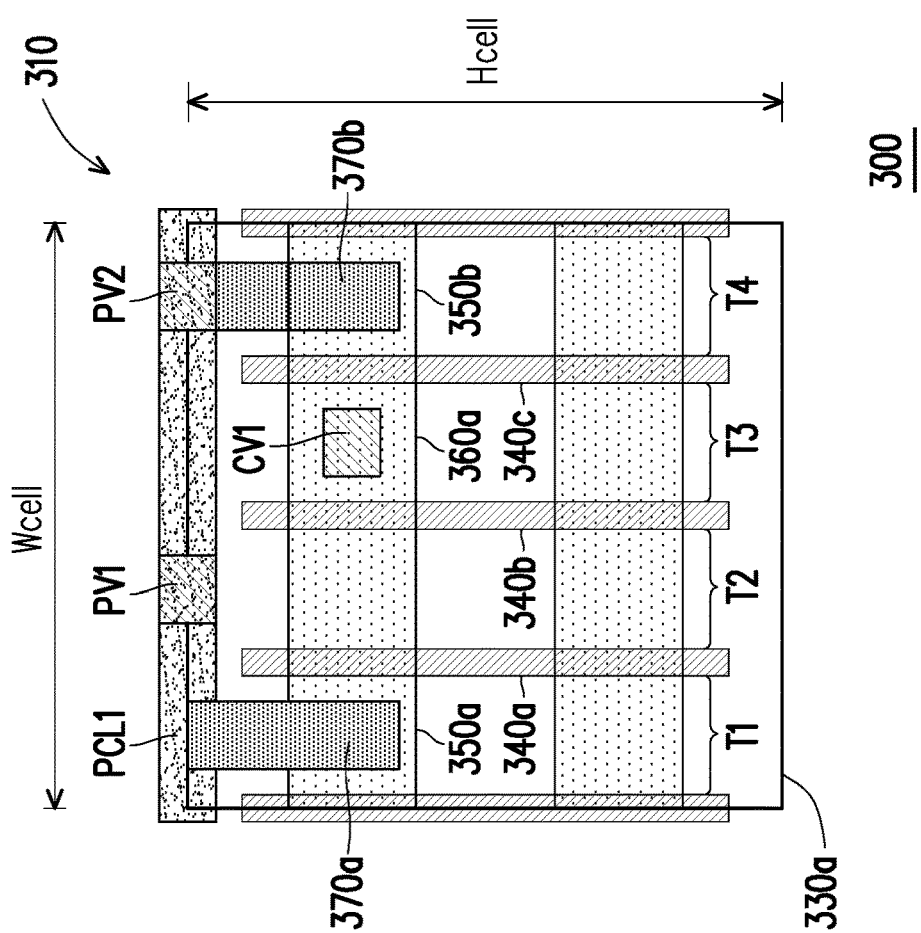

FIGS. 3 and 4 are schematic top views illustrating the second exemplary embodiment of a cell library 300 according to the present disclosure. This embodiment differs from the previous embodiment in that the cells of the cell library 300 include power vias and contact vias at different tracks thereof. For example, a first set of the cells of the cell library 300 includes power vias at even-numbered tracks thereof and contact vias at odd-numbered tracks thereof (e.g., cell 310). A second set of the cells of the cell library 300 includes power vias at odd-numbered tracks thereof and contact vias at even-numbered tracks thereof (e.g., cell 410). In other words, the odd-numbered tracks of the cells in the first set and the even-numbered tracks of the cells in the second set are void of power vias. The even-numbered tracks of the cells in the first set and the odd-numbered tracks of the cells in the second sets are void of contact vias.

In the example of FIG. 3, a first cell 310 of the cell library 300 is over a substrate, is enclosed by a cell boundary 330a, has a cell height (Hcell) and a cell width (Wcell), and includes gate electrodes 340a-340c, source regions 350a, 350b, a drain region 360a, contact conductive lines 370a, 370b, a contact via (CV1), power vias (PV1, PV2), and a power conductive line (PCL1). As can be seen from FIG. 3, the gate electrodes 340a-340c extend along the cell height (Hcell) of the cell 310 and are arranged along the cell width (Wcell) of the cell 310. When numbered from a left edge of the cell boundary 330a, the cell 310 is divided by the gate electrodes 340a-340c into odd-numbered tracks (T1, T3) and even-numbered tracks (T2, T4).

It is noted herein that, although the source region 350a and the contact conductive line 370a are at the odd-numbered track (T1), by virtue of the power conductive line (PCL1), the power via (PV1) does not have to be at the same track as the source region 350a and is at the even-numbered track (T2). The source region 350b, the contact conductive line 370b, and the power via (PV2) are at the even-numbered track (T4). The drain region 360a and the contact via (CV1) are at the odd-numbered track (T3). The power conductive line (PCL1) interconnects the contact conductive lines 370a, 370b, is disposed at a top edge of the cell boundary 330a, and spans across the tracks (T1-T4).

In the example of FIG. 4, a second cell 410 of the cell library 300 is over a substrate, is enclosed by a cell boundary 430a, has a cell height (Hcell) and a cell width (Wcell), and includes gate electrodes 440a, 440b, source regions 450a, 450b, a drain region 460a, contact conductive lines 470a, 470b, a contact via (CV2), power vias (PV3, PV4), and a power conductive line (PCL2). As can be seen from FIG. 4, the gate electrodes 440a, 440b extend along the cell height (Hcell) of the cell 410 and are arranged along the cell width (Wcell) of the cell 410. When numbered from a left edge of the cell boundary 430a, the cell 410 is divided by the gate electrodes 440a, 440b into odd-numbered tracks (T5, T7) and an even-numbered track (T6).

The source region 450a, the contact conductive line 470a, and the power via (PV3) are at the odd-numbered track (T5). The source region 450b, the contact conductive line 470b, and the power via (PV4) are at the odd-numbered track (T7). The drain region 460a and the contact via (CV2) are at the even-numbered track (T6). The power conductive line (PCL2) interconnects the contact conductive lines 470a, 470b, is disposed at a top edge of the cell boundary 430b, and spans across the tracks (T5-T7).

As illustrated in FIGS. 3 and 4, because the power vias (PV1-PV4) are at different tracks than the contact vias (CV1, CV2), vertical distances between the power conductive lines (PCL1, PCL2), and thus the power vias (PV1-PV4), and the contact vias (CV1, CV2) are made less than the minimum distance design rule threshold to shorten cell heights of the cells 310, 410.

Figure 5:
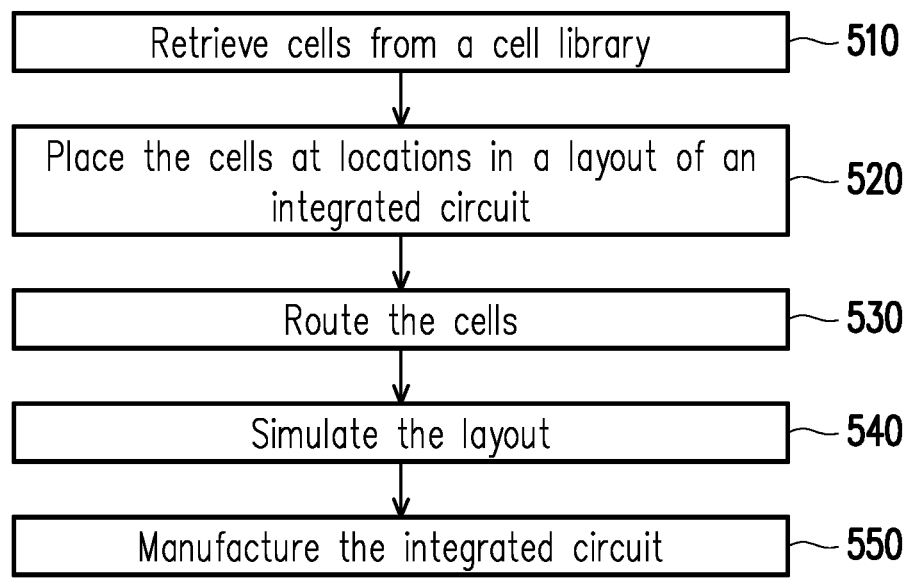
FIG. 5 is a flow chart illustrating the first exemplary embodiment of a method of manufacturing an integrated circuit according to the present disclosure.
Figure 6:
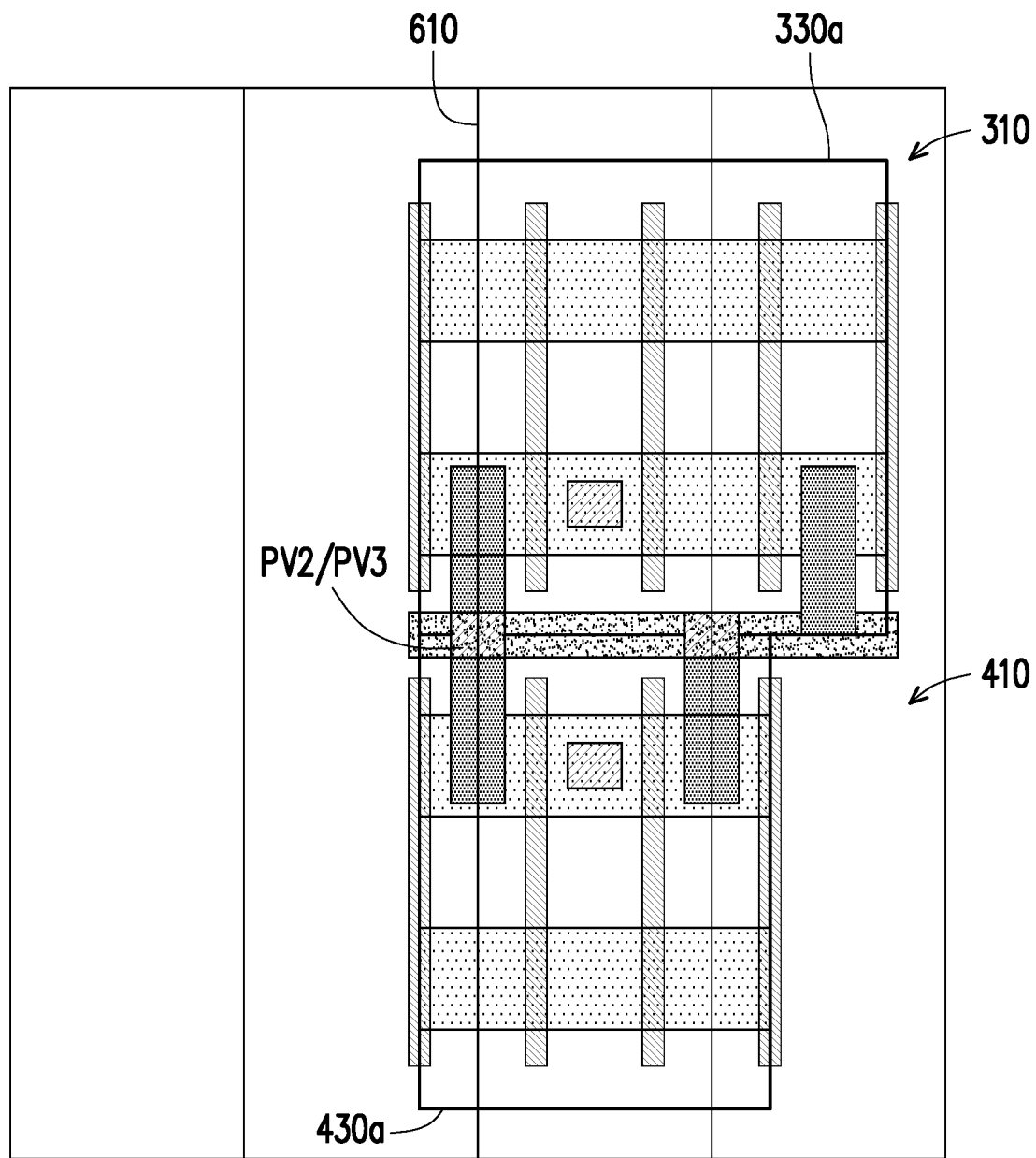
FIG. 6 is a schematic top view illustrating an exemplary integrated circuit layout according to the present disclosure.
Figure 7:
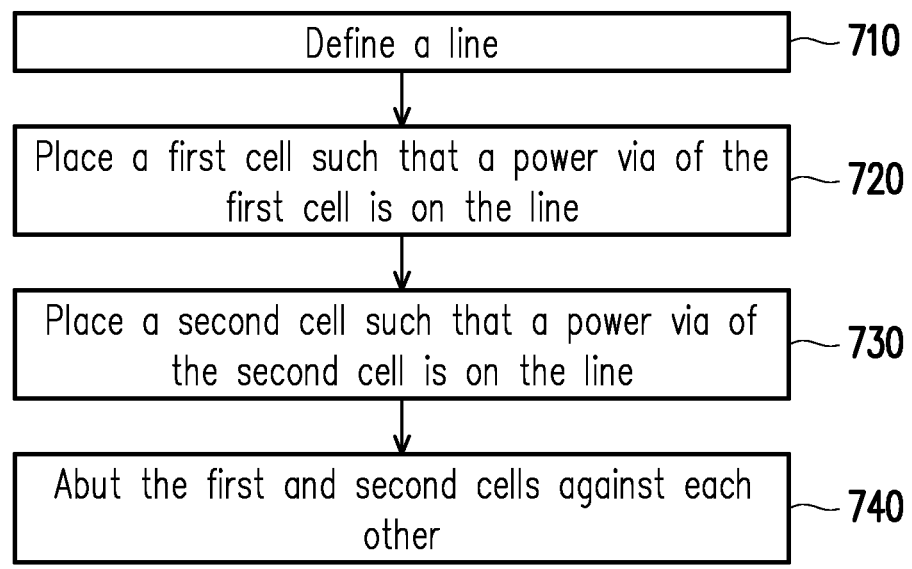
FIG. 7 is a flow chart illustrating an exemplary operation of a method according to the present disclosure.

FIG. 5 is a flow chart illustrating the first exemplary embodiment of a method 500 of manufacturing an integrated circuit according to the present disclosure. The method 500 is described with further reference to FIGS. 3 and 4 and subsequent figures, e.g., FIGS. 6 and 7, for ease of understanding. It should be understood that the method 500 is applicable to structures other than those of FIGS. 3, 4, and 6. FIG. 6 is a schematic top view illustrating an exemplary integrated circuit layout 600 according to the present disclosure. FIG. 7 is a flow chart illustrating an exemplary operation 520 of method 500 according to the present disclosure.

In operation 510, the APR tool retrieves cells from the cell library 300. In operation 520, the APR tool places cells at various locations in a layout, e.g., integrated circuit layout 600, of an integrated circuit. In this embodiment, operation 520 includes sub-operations, e.g., sub-operations 710-740. In sub-operation 710, a line 610, e.g., a vertical line, is defined for example at a middle of the layout 600.

In sub-operation 720, a first cell, e.g., cell 310, of the cell library 300 is placed at a first row of the layout 600 such that the power via (PV2) of the cell 310 is on the line 610. In sub-operation 730, a second cell, e.g., cell 410, of the cell library 300 is placed at a second row adjacent the first row such that the power via (PV3) of the cell 410 is on the line 610. In operation 740, the top edges of the cell boundaries 330a, 430a of the cells 310, 410 are abut against each other. As illustrated in FIG. 6, the structures of the cells of the cell library 300 and sub-operations 710-740 insure that the abutment between a pair of cells of the cell library 300 complies with the minimum distance design rule.

Referring back to FIG. 5, in operation 530, the APR tool routes, interconnecting, the cells, to thereby enable the layout to perform a circuit function. Next, in operation 540, the APR tool simulates the layout to verify whether the layout functions as intended. Thereafter, in operation 550, integrated circuits having a high cell density are manufactured from the layout.

Figure 8:
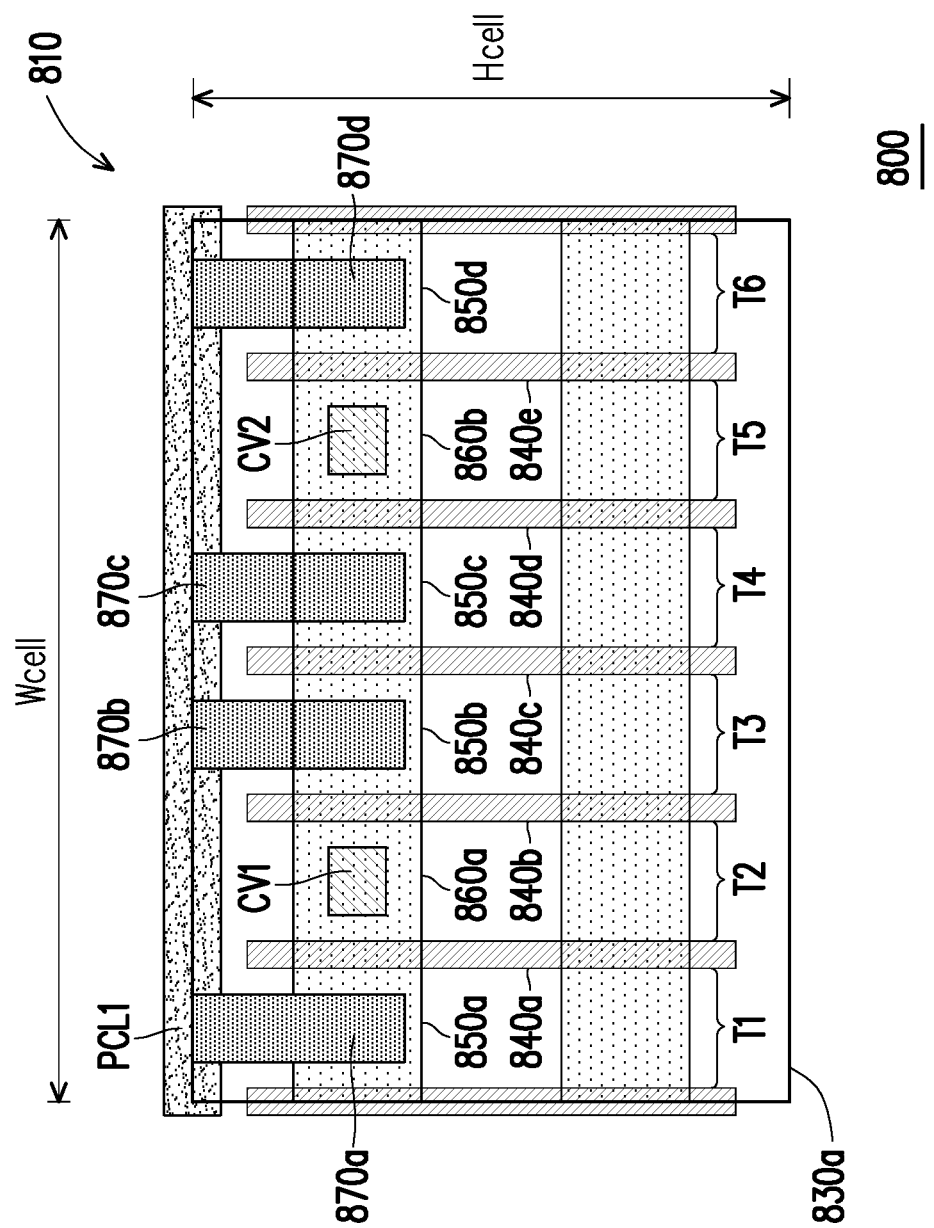
FIGS. 8 and 9 are schematic top views illustrating the third exemplary embodiment of a cell library according to the present disclosure.
Figure 9:
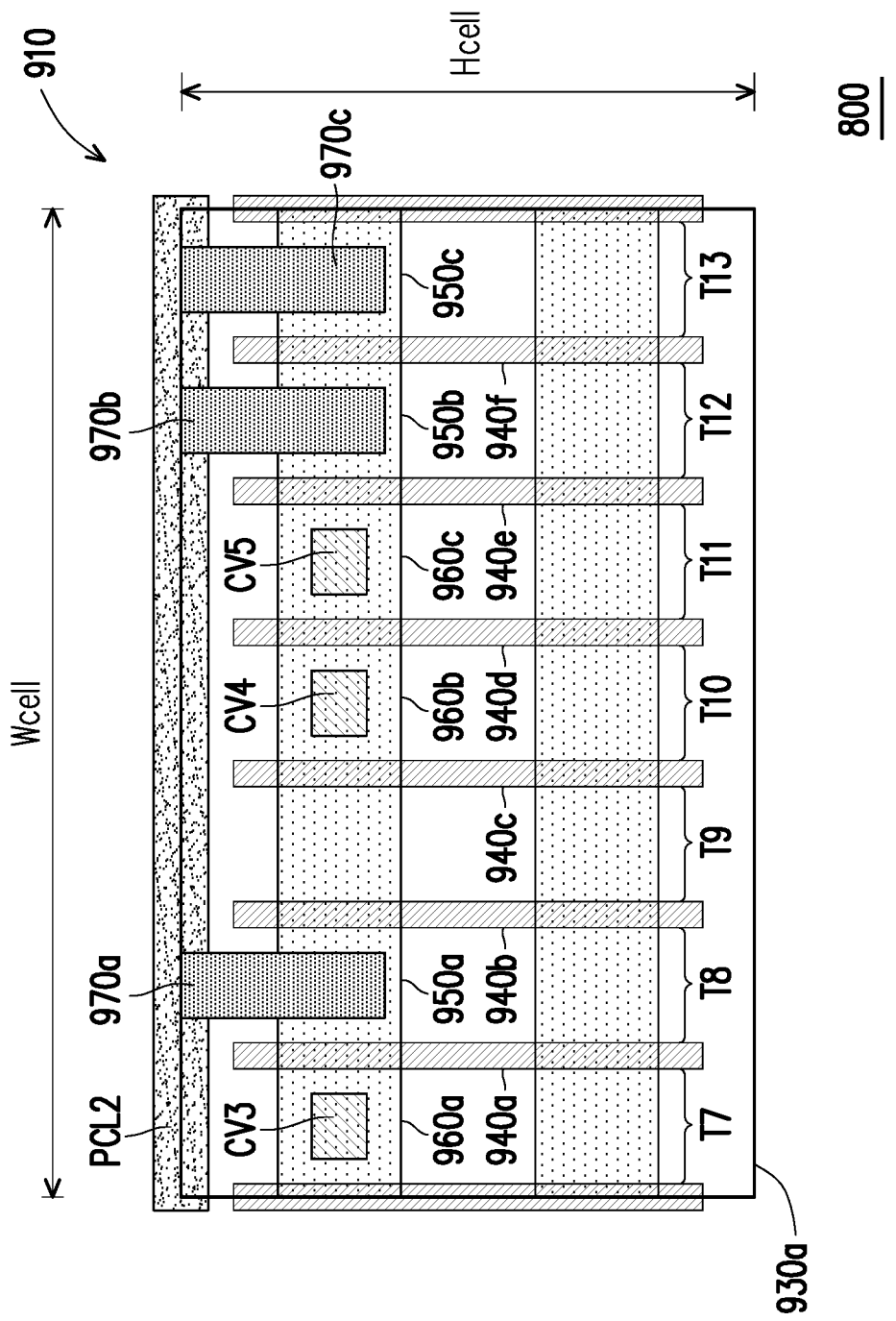

FIGS. 8 and 9 are schematic top views illustrating the third exemplary embodiment of a cell library 800 according to the present disclosure. This embodiment differs from the previous embodiments in that, substantially, all cells of the cell library 800 do not have power vias. The constructions as such of the cells of the cell library 800, as described hereinafter, permits insertion of power vias after placement and routing operations during the design of a layout. This maximizes power vias that can be connected to a cell, whereby electromigration and IR drop are minimized.

In the example of FIG. 8, a first cell 810 of the cell library 800 is over a substrate, is enclosed by a cell boundary 830a, has a cell height (Hcell) and a cell width (Wcell), and includes gate electrodes 840a-840e, source regions 850a-850d, drain regions 860a, 860b, contact conductive lines 870a-870d, contact via (CV1, CV2), and a power conductive line (PCL1). As can be seen from FIG. 8, the gate electrodes 840a-840e extend along the cell height (Hcell) of the cell 810 and are arranged along the cell width (Wcell) of the cell 810. When numbered from a left edge of the cell boundary 830a, the cell 810 is divided by the gate electrodes 840a-840e into tracks (T1-T6).

The source regions 850a-850d, as well as the contact conductive lines 870a-870d, are at the tracks (T1, T3, T4, T6), respectively. The drain regions 860a, 860b, as well as the contact vias (CV1, CV2), are at the tracks (T2, T5), respectively. The power conductive line (PCL1) interconnects the contact conductive lines 870a-870d, is disposed at a top edge of the cell boundary 830a, and spans across the tracks (T1-T6).

In the example of FIG. 9, a second cell 910 of the cell library 800 is over a substrate, is enclosed by a cell boundary 930a, has a cell height (Hcell) and a cell width (Wcell), and includes gate electrodes 940a-940f, source regions 950a-950c, drain regions 960a-960c, contact conductive lines 970a-970c, contact vias (CV3-CV5), and a power conductive line (PCL2). As can be seen from FIG. 9, the gate electrodes 940a-940f extend along the cell height (Hcell) of the cell 910 and are arranged along the cell width (Wcell) of the cell 910. When numbered from a left edge of the cell boundary 930a, the cell 910 is divided by the gate electrodes 940a-940f into tracks (T7-T13).

The source regions 950a-950c, as well as the contact conductive lines 970a-970c, are at the tracks (T8, T12, T13), respectively. The drain region 960a-960c, as well as the contact vias (CV3-CV5), are at the tracks (T7, T10, T11), respectively. The power conductive line (PCL2) interconnects the contact conductive lines 970a-970c, is disposed at a top edge of the cell boundary 930a, and spans across the tracks (T7-T13).

FIGS. 10 and 11 are tables illustrating the fourth exemplary embodiment of a cell library 1000 according to the present disclosure. This embodiment differs from the previous embodiments in that the cell library 1000 includes a plurality of parent cells 1010, 1110, each of which has children cells 1010a, 1010b, 1110a-1110c. The parent cells 1010, 1110 have different cell functions. In the examples of FIGS. 10 and 11, the parent cell 1010 is an inverter. The parent cell 1110 is a combination of a pair of logic gates, e.g., AND and OR gates. The parent cell 1010 and the children cells 1010a, 1010b thereof have the same cell function, are of the same cell height and cell width, and include the same number of transistors. As illustrated in FIG. 10, the parent cell 1010 and the children cells 1010a, 1010b thereof includes different numbers of power vias and are assigned with different timing information, e.g., time delays. The timing information may further include transition delay and timing relationship between clock and data signals. Time delay is the interval between an input is received and an output is provided by a cell. Transition delay is the interval between a signal of the cell rises/falls from one state to another. Clock signal is a signal that oscillates between low and high states to coordinate operations of cells. Data signal is a signal that represents bits, '0s' and '1s', of data.

Similarly, the parent cell 1110 and the children cells 1110a-1110c thereof have the same cell function, are of the same cell height and cell width, and include the same number of transistors. As illustrated in FIG. 11, the parent cell 1110 and the children cells 1110a-1110c thereof have different numbers of power vias and are assigned with different timing information, e.g., time delay. It should be understood that the cell library 1000 may include any number of parent cells, each of which includes any number of children cells. The timing information of the children cells may be relative to the timing information of their parent cells. For example, the ratio of the time delay of the child cell 1110b to the time delay of the parent cell 1110 is 1:2. As another example, the child cell 1110c is assigned with a time delay of 35 ps. less than the time delay of the parent cell 1110.

Each of the cell libraries 100, 300, 800, 1000 is in the form of a database that may be stored in a computer-readable non-transitory storage medium. Accordingly, the present disclosure includes an embodiment of a computer-readable non-transitory storage medium having a set of computer-executable program instructions stored therein. The set of computer-executable program instructions, when executed by a processor of a computer, provide at least one of the cell libraries 100, 300, 800, 1000 for the design and manufacture of an integrated circuit. The computer-readable non-transitory storage medium may be a hard disk drive (HDD) (e.g., internal or external HDD), an optical disc (e.g., CD-ROM and DVD-ROM), a memory device (e.g., universal serial bus (USB) memory device), a memory card (e.g., secure digital (SD) card), any suitable storage medium, or a combination thereof.

Figure 12:
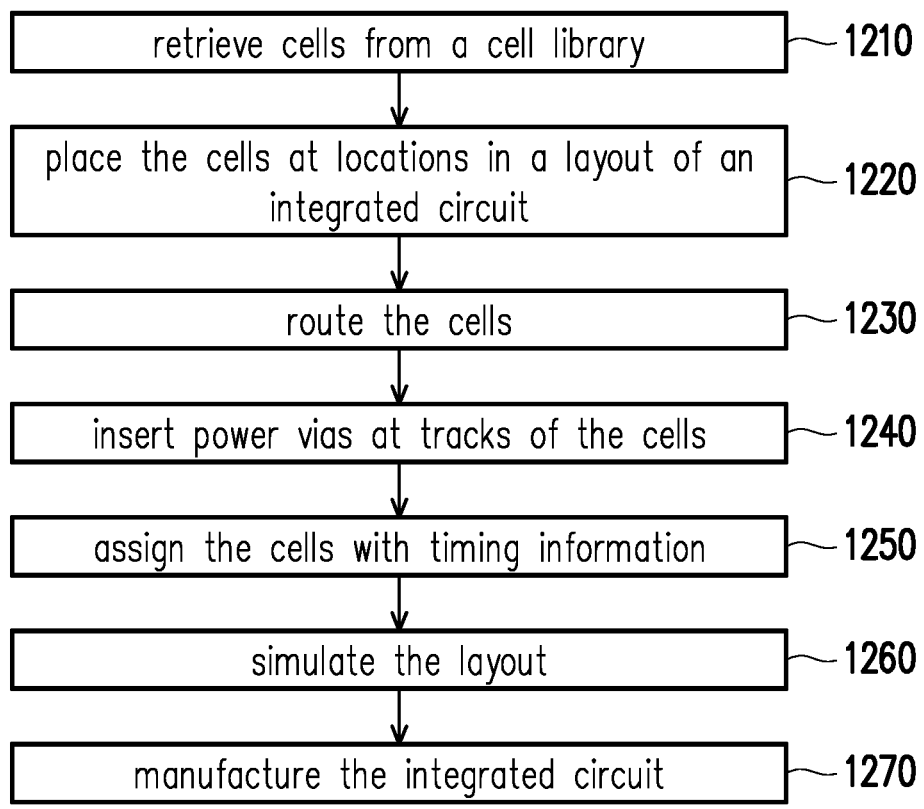
FIG. 12 is a flow chart illustrating the second exemplary embodiment of a method of manufacturing an integrated circuit according to the present disclosure.
Figure 13:
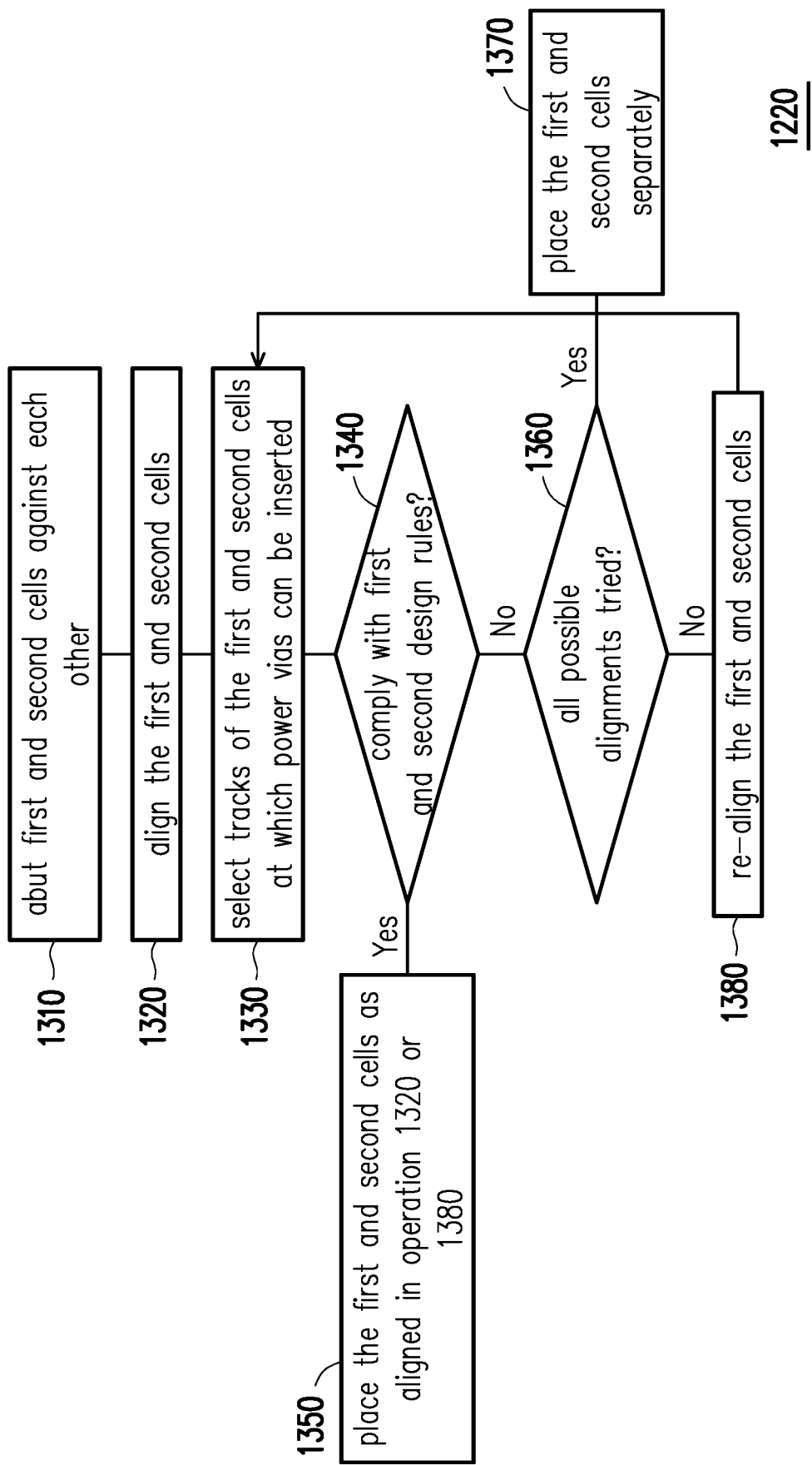
FIG. 13 is a flow chart illustrating an exemplary of an operation of a method according to the present disclosure.
Figure 14:
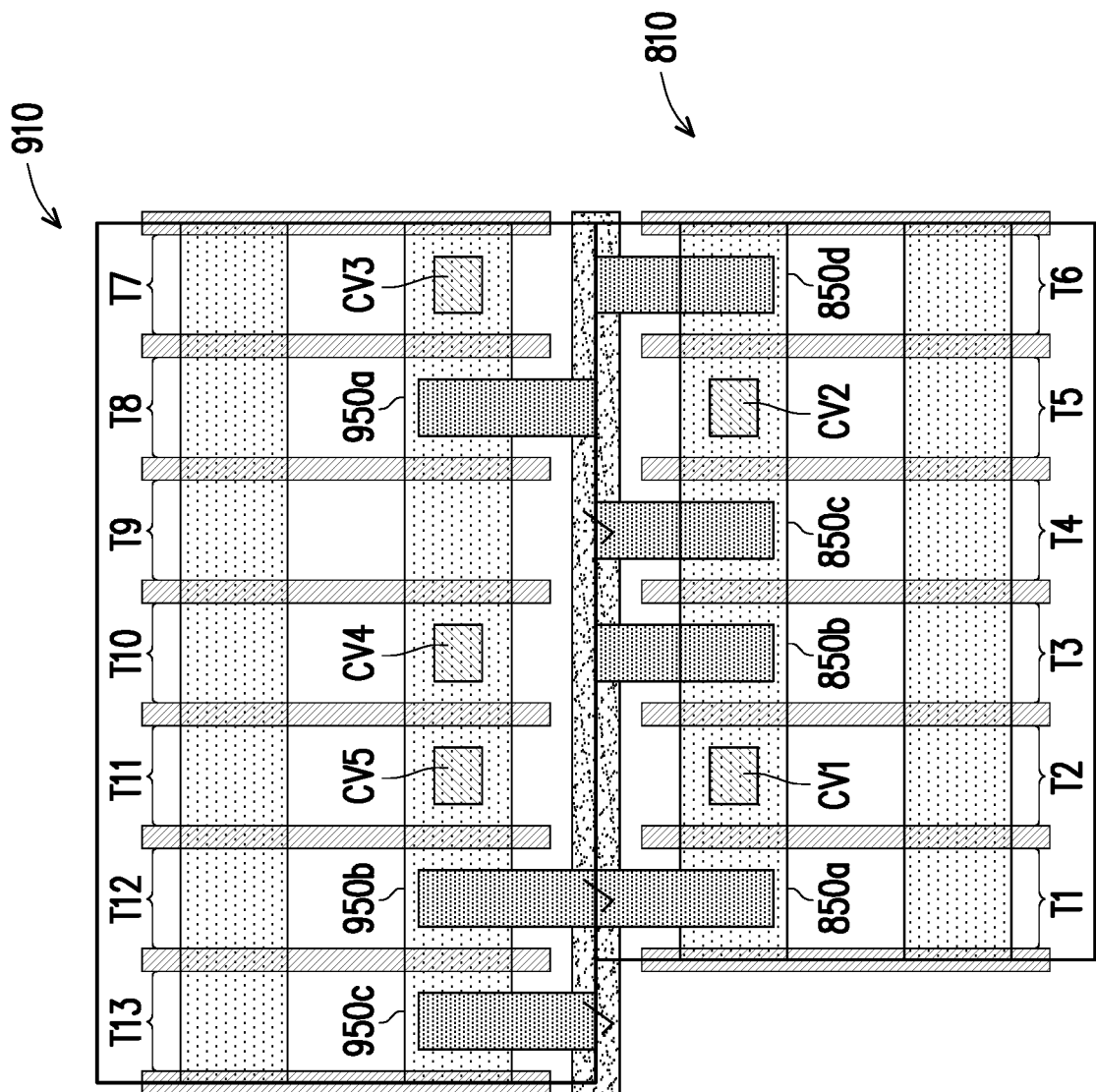
FIGS. 14-16 are schematic top views illustrating exemplary alignments between cells according to the present disclosure.
Figure 15:
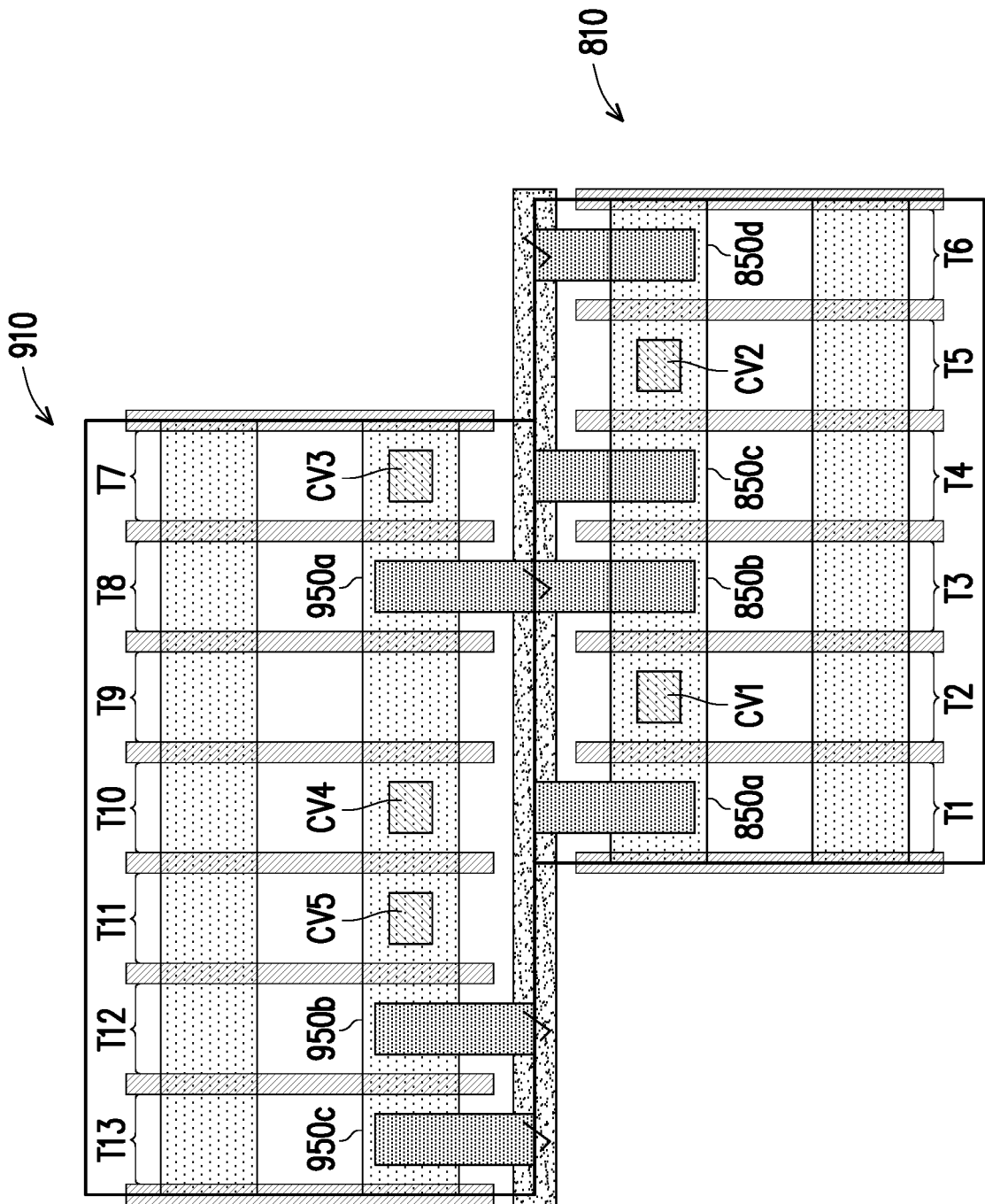
Figure 16:
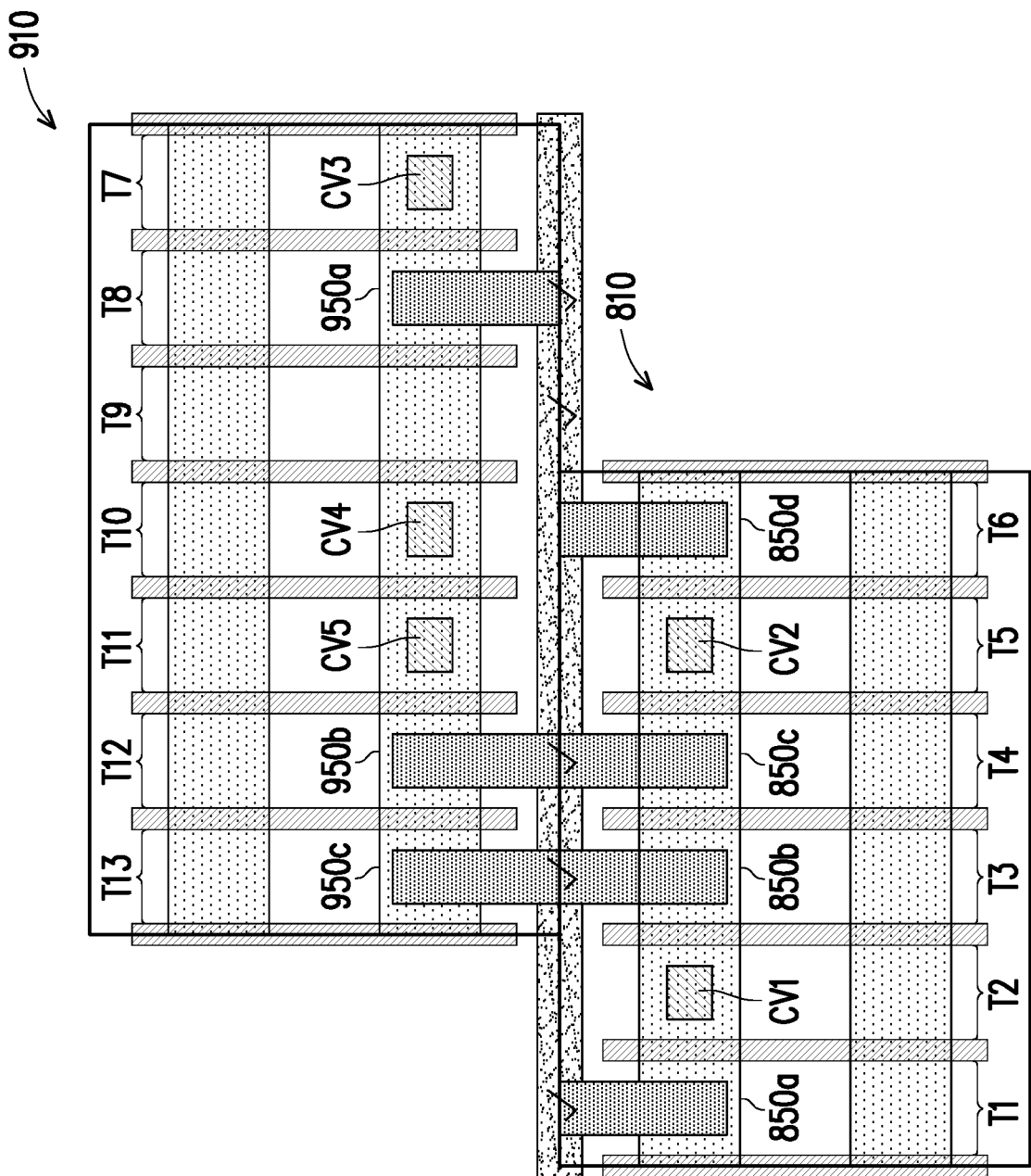

FIG. 12 is a flow chart illustrating the second exemplary embodiment of a method 1200 of manufacturing an integrated circuit according to the present disclosure. The method 1200 is described with further reference to FIGS. 8-11 and subsequent figures, e.g., FIGS. 13-16, for ease of understanding. It should be understood that the method 1200 is applicable to structures other than those of FIGS. 8-11 and 14-16. FIG. 13 is a flow chart illustrating an exemplary operation 1220 of method 1200 according to the present disclosure. FIGS. 14-16 are schematic top views illustrating exemplary alignments between cells according to the present disclosure.

In operation 1210, the APR tool retrieves cells from the cell library 800. In operation 1220, the APR tool places the cells at various locations in a layout of an integrated circuit. In this embodiment, operation 1220 includes sub-operations, e.g., sub-operations 1310-1380. In sub-operation 1310, the APR tool abuts top edges of cell boundaries of first and second cells, e.g., cells 810, 910, against each other.

In sub-operation 1320, the APR tool aligns tracks of the cells 810, 910 with each other, e.g., as in FIG. 14, 15, or 16. As shown in FIG. 14, the tracks (T1-T6) are aligned with the tracks (T12-T7), respectively. On the other hand, as shown in FIG. 15, the tracks (T1-T4) are aligned with the tracks (T10-T7), respectively, whereas, as shown in FIG. 16, the tracks (T3-T6) are aligned with the tracks (T13-T10), respectively.

In sub-operation 1330, the APR tool selects tracks of the cells 810, 910 at which power vias can be inserted in compliance with the minimum distance design rule. In the examples of FIGS. 14-16, the APR tool selects tracks with check marks because the contact vias (CV1-CV5) are not at those tracks and power vias can thus be inserted at those tracks without violating the minimum distance design rule.

In sub-operation 1340, the APR tool checks whether the alignment between the cells 810, 910 complies with a power via-source region ratio design rule and a power via-source region distance design rule. In this embodiment, the power via-source region ratio design rule requires that the ratio of power vias that can be connected to cells that abut against each other to source regions of the cells is equal to or greater than 0.5. In the example of FIG. 14, the ratio of power vias, i.e., 3, that can be connected to the cells 810, 910 to the source regions 850*a*-850*d*, 950*a*-950*c*, i.e., 7, is less than 0.5. As such, the alignment of FIG. 14 violates the power via-source region ratio design rule.

The power via-source region distance design rule requires that a power via is inserted at the same track as or a track adjacent a track of each of source regions. In the example of FIG. 14, while a power via can be inserted at the same track as each of the source regions 850*a*, 850*c*, 950*a*, 950*b*, and while a power via can be inserted at a track adjacent a track of each of the source regions 850*a*-850*c*, 950*a*-950*c*, a power via cannot be inserted at the same track as or a track adjacent a track of the source region 950*d*. As such, the alignment of FIG. 14 also violates the power via-source region distance design rule.

In the example of FIG. 15, the ratio of power vias, i.e., 4, that can be connected to the cells 810, 910 to the source regions 850*a*-850*d*, 950*a*-950*c*, i.e., 7, is greater than 0.5. As such, the alignment of FIG. 15 complies with the power via-source region ratio design rule. However, while a power via can be inserted at the same track as each of the source regions 850*b*, 850*d*, 950*a*-950*c*, and while a power via can be inserted at a track adjacent a track of each of the source regions 850*c*, 950*a*, 950*b*, a power via cannot be connected to the same track as or a track adjacent a track of the source region 850*a*. As such, the alignment of FIG. 15 violates the power via-source region distance design rule.

In the example of FIG. 16, the ratio of power vias, i.e., 5, that can be connected to the cells 810, 910 to the source regions 850*a*-850*d*, 950*a*-950*c*, i.e., 7, is greater than 0.5.

Further, a power via can be inserted at the same track as each of the source regions 850*a*-850*c*, 950*a*-950*c* and a power via can be inserted at a track adjacent a track of the source region 850*d*. As such, the alignment of FIG. 16 complies with both the power via-source region ratio design rule and the power via-source region distance design rule.

Referring back to FIG. 13, when it is determined that the alignment complies with both the power via-source region ratio design rule and the power via-source region distance design rule, the flow proceeds to sub-operation 1350. Otherwise, i.e., it is determined that the alignment violates both/either the power via-source region ratio design rule and/or the power via-source region distance design rule, the flow proceeds to sub-operation 1360.

In sub-operation 1360, the APR tool determines whether all possible alignments between the cells 810, 910 have been tried. In the affirmative, the flow proceeds to sub-operation 1370. Otherwise, the flow proceeds to sub-operation 1380.

In sub-operation 1380, the APR tool re-aligns the cells 810, 910. Thereafter, the flow goes back to sub-operation 1330. In sub-operation 1370, the APR tool places the cells 810, 910 in the integrated circuit layout separately. In sub-operation 1350, the APR tool places the cells 810, 910 as aligned in sub-operation 1320 or as re-aligned in sub-operation 1380.

Figure 17:
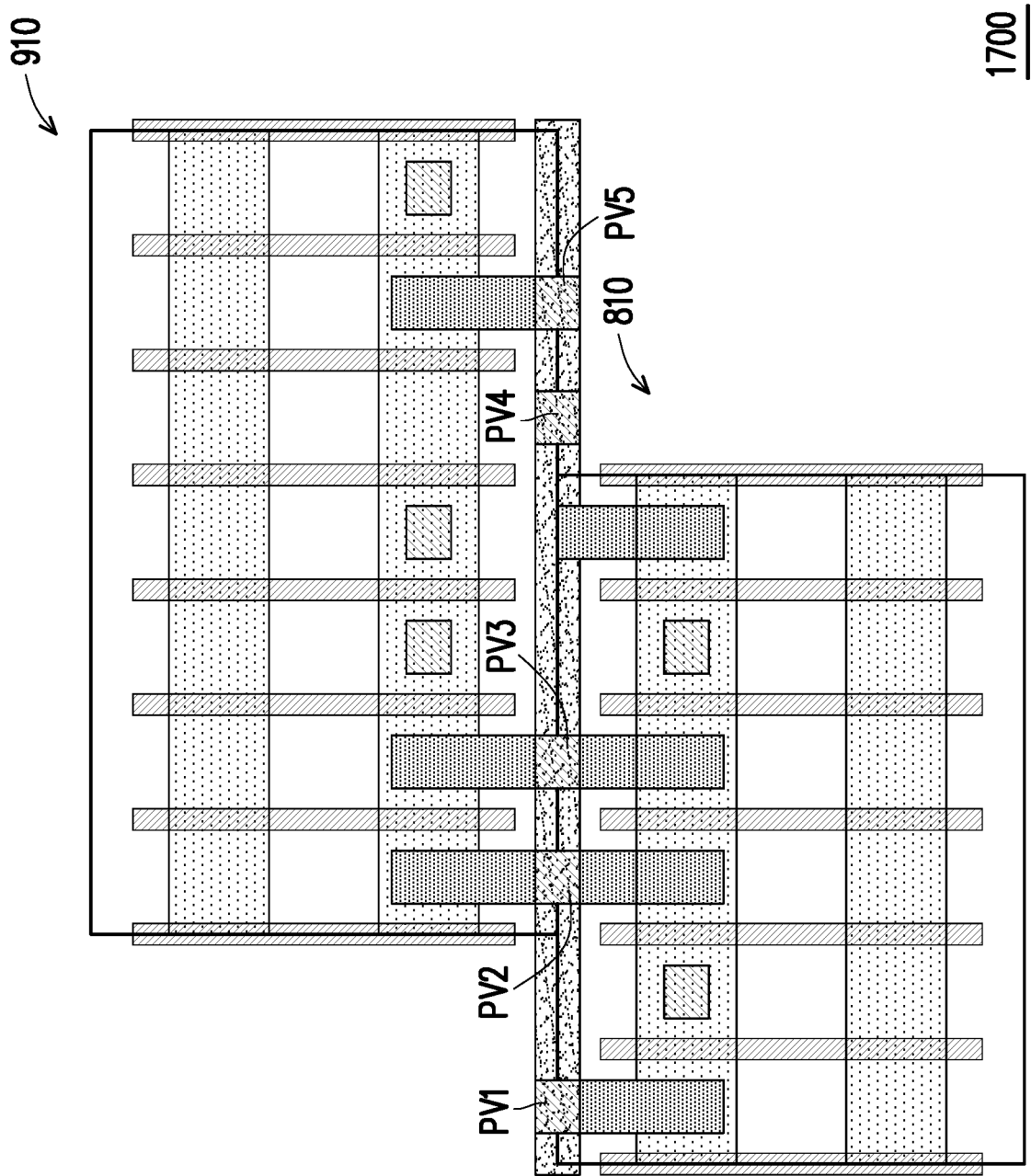
FIG. 17 is a schematic top view illustrating an exemplary integrated circuit layout according to the present disclosure.

Referring back to FIG. 12, in operation 1230, the APR tool routes, interconnecting, the cells to thereby enable the layout to perform a circuit function. In operation 1240, the APR tool inserts power vias at the tracks selected in sub-operation 1330, thereby connecting the cells to the supply conductive line, e.g., supply conductive line 210. For example, FIG. 17 is schematic top view illustrating power vias connected to cells, e.g., cells 810, 910, according to the present disclosure. As shown, power vias (PV1-PV5) are inserted at tracks (tracks with check marks in FIG. 16) of cells 810, 910 selected in sub-operation 1330.

In operation 1250, the APR tool assigns timing information to the cells. In this embodiment, operation 1250 includes: counting the number of power vias of a cell; accessing a cell library, e.g., cell library 1000, to obtain timing information of the cell; and assigning the obtained timing information to the cell. In the example of FIG. 17, the cell 810, which, e.g., corresponds to the child cell 1010*a*, includes three power vias (PV1-PV3). The cell 910, which, e.g., corresponds to the child cell 1110*a*, includes four power vias (PV2-PV5). As such, the APR tool obtains the timing information 20 ps. and 40 ps. and assigned them to the cells 810, 910, respectively.

Referring back to FIG. 1000, in operation 1260, the APR tool simulates the layout, verifying whether the layout functions as intended. Thereafter, in operation 1270, integrated circuits having a high cell density are manufactured from the layout.

In one embodiment, an integrated circuit comprises a cell that is between a substrate and a supply conductive line and that includes a source region, a contact conductive line, a power conductive line, and a power via. The contact conductive line extends from the source region. The power conductive line is coupled to the contact conductive line. The power via interconnects the supply conductive line and the power conductive line In another embodiment, a computer-readable non-transitory storage medium having a set of computer-executable program instructions stored therein for providing a cell library for the design and manufacture of an integrated circuit. The cell library comprises a parent cell and a child cell. The parent cell includes a power via configured to receive a supply voltage. The child cell is configured to perform the same cell function as the parent cell and includes a power via configured to receive the supply voltage. The parent cell and the child cell include different numbers of power vias.

In another embodiment, a method comprises retrieving cells from a cell library and placing the cells at locations in a layout of an integrated circuit. Retrieving the cells includes retrieving first and second cells, each of which includes a plurality of gate electrodes, a source region, a contact conductive line, and a power conductive line. Each of the first and second cells is divided by the gate electrodes thereof into a plurality of tracks. The contact conductive line extends from the source region. The power conductive line is coupled to the contact conductive line and spans across the tracks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a cell between a substrate and a supply conductive line and including
      a source region,
      a contact conductive line that extends from the source region,
      a power conductive line coupled to the contact conductive line, and
   a second cell, wherein the cell and the second cell abut each other in a vertical direction, such that the power conductive line of the cell abuts a second power conductive line of the second cell.

2. The integrated circuit of claim 1, wherein:
   the cell further includes a plurality of gate electrodes that divide the cell into a plurality of tracks, a first track including the source region, a second track including a drain region and a contact via that couples the drain region to a signal conductive line;
   the power conductive line spans across the plurality of the tracks, whereby the power via is positionable at a track different from a track at which the contact via resides and from tracks at which contact vias of neighboring cells reside and whereby the power conductive line, and thus the power via, and the contact via have a vertical distance therebetween of less than a threshold of a minimum distance design rule, without violating the minimum distance design rule.

3. The integrated circuit of claim 1, wherein the cells is enclosed by a cell boundary that has a top edge at which the power conductive line is disposed.

4. The integrated circuit of claim 1, wherein:
   the cell further includes a plurality of gate electrodes that divide the cell into a plurality of tracks; and
   the power conductive line spans across the plurality of the tracks.

5. The integrated circuit of claim 4, wherein:
   the cell further includes a drain region and a contact via that couples the drain region to a signal conductive line; and
   the power via and the contact via are at different tracks.

6. The integrated circuit of claim 5, wherein the contact via and one of the power conductive line and the power via have a vertical distance therebetween of less than a threshold of a minimum distance design rule.

7. The integrated circuit of claim 1, wherein the power via of the cell and a power via of the second cell are positioned collinearly.

8. The integrated circuit of claim 2, wherein the first track of the cell is aligned with a first track of the second cell, and wherein the second track of the cell is aligned with a second track of the second cell.

9. A circuit, comprising:
   a first cell and a second cell, each of which includes:
      a plurality of gate electrodes, each of the first and second cells being divided by the plurality of the gate electrodes thereof into a plurality of tracks,
      a source region,
      a contact conductive line that extends from the source region, and
      a power conductive line that is coupled to the contact conductive line and that spans across the tracks;
   wherein the cell and the second cell abut each other in a vertical direction, such that the power conductive line of the cell abuts the power conductive line of the second cell.

10. The circuit of claim 9,
    wherein a line is defined in the circuit, wherein the first and second cells abut one another and are placed such that the power vias thereof are on the line.

11. The circuit of claim 9, wherein the first and second cells abut against each other, tracks of the first and second cells are aligned with each other according to a design parameter.

12. The circuit of claim 11, wherein the design parameter identifies a ratio of power vias connected to the first and second cells to source regions of the first and second cells is equal to or greater than 0.5.

13. The circuit of claim 11, wherein the design parameter identifies a power via that is fabricated at the same track as a source region.

14. The circuit of claim 11, wherein the design parameter identifies a power via is fabricated at a track adjacent a track of a source region.

15. The circuit of claim 9, wherein a power via is connected to the first cell.

16. An integrated circuit, comprising:
    a parent cell including a power via configured to receive a supply voltage; and
    a child cell configured to perform a same cell function as the parent cell and including a power via configured to receive the supply voltage, wherein the parent cell and the child cell include different numbers of power vias;
    wherein the parent cell and the child cell abut each other in a vertical direction, such that a first power conductive line of the parent cell abuts a second power conductive line of the child cell.

17. The integrated circuit of claim 16, wherein the parent cell and the child are of the same cell height and width.

18. The integrated circuit of claim 16, wherein the parent cell and the child cell include the same number of transistors.

19. The integrated circuit of claim 16, wherein the vertical direction is perpendicular to the substrate.

20. The integrated circuit of claim 1, wherein the vertical direction is perpendicular to the substrate.

\* \* \* \* \*